(12) United States Patent
Bettoni et al.

(10) Patent No.: US 9,258,882 B2
(45) Date of Patent: Feb. 9, 2016

(54) ELECTRONIC DEVICES COMPRISING PRINTED CIRCUIT BOARDS

(71) Applicants: Davide Bettoni, Pont Saint Martin (IT); Giorgio Stirano, Pont Saint Martin (IT)

(72) Inventors: Davide Bettoni, Pont Saint Martin (IT); Giorgio Stirano, Pont Saint Martin (IT)

(73) Assignees: MAVEL S.R.L., Pont Saint Martin (IL); IPP ENERGIES NOUVELLES, Rueil-Malmaison (FR)

( * ) Notice: Subject to any disclaimer, the term of this patent is extended or adjusted under 35 U.S.C. 154(b) by 65 days.

(21) Appl. No.: 14/289,126

(22) Filed: May 28, 2014

(65) Prior Publication Data

US 2014/0355213 A1 Dec. 4, 2014

(30) Foreign Application Priority Data

May 29, 2013 (IT) .............................. MI2013A0872

(51) Int. Cl.
*G06F 1/16* (2006.01)
*H05K 5/00* (2006.01)
(Continued)

(52) U.S. Cl.
CPC ............ *H05K 1/0204* (2013.01); *H05K 1/0206* (2013.01); *H05K 1/0265* (2013.01); *H05K 1/181* (2013.01); *H05K 1/0298* (2013.01); *H05K 1/113* (2013.01); *H05K 3/0061* (2013.01); *H05K 3/42* (2013.01); *H05K 2007/204* (2013.01); *H05K 2201/0979* (2013.01); *H05K 2201/09236* (2013.01); *H05K 2201/09309* (2013.01); *H05K 2201/09609* (2013.01); *H05K 2201/10022* (2013.01); *H05K 2201/10053* (2013.01); *H05K 2201/10166* (2013.01)

(58) Field of Classification Search
CPC .... H05K 1/181; H05K 1/0204; H05K 1/0206
USPC .......... 361/715, 717, 718, 719, 720, 721, 722
See application file for complete search history.

(56) References Cited

U.S. PATENT DOCUMENTS 6,081,426 A * 6/2000 Takeda ................ H01L 23/3128
165/185
6,483,706 B2 * 11/2002 Vinciarelli .......... H01L 23/3735
174/16.3

(Continued)

FOREIGN PATENT DOCUMENTS

DE 102007003182 A1 7/2008

OTHER PUBLICATIONS

Italian Patent and Trademark Office International Search Report issued Jan. 21, 2014.

*Primary Examiner* — Anthony Haughton
(74) *Attorney, Agent, or Firm* — Harness, Dickey & Pierce, PLC

(57) ABSTRACT

An electronic device may include at least one power component and a printed circuit board. The at least one power component may include a main body and a lead. The printed circuit board may include at least two conductive layers parallel to a plane. The printed circuit board may further include a mounting element and a conductor. The mounting element may include first conductive tubes. The conductor may include second conductive tubes. The first conductive tubes and the second conductive tubes may elongate through a thickness of the printed circuit board along a direction substantially perpendicular to the plane. The main body of the at least one power component may be fixed to the mounting element. The lead of the at least one power component may be fixed to the conductor.

20 Claims, 2 Drawing Sheets

(51) Int. Cl.
  *H05K 7/00* (2006.01)
  *H05K 1/02* (2006.01)
  *H05K 1/18* (2006.01)
  *H05K 1/11* (2006.01)
  *H05K 3/00* (2006.01)
  *H05K 3/42* (2006.01)
  *H05K 7/20* (2006.01)

(56) References Cited

U.S. PATENT DOCUMENTS

| | | | |
|---|---|---|---|
| 6,921,273 B2 * | 7/2005 | Rodrigues | H05K 5/006 439/76.1 |
| 7,323,359 B2 * | 1/2008 | Lenz | H01L 24/27 257/E21.51 |
| 7,464,280 B2 * | 12/2008 | Morris | G06F 1/26 713/300 |
| 7,952,197 B2 | 5/2011 | Stoehr et al. | |
| 8,072,755 B2 * | 12/2011 | Yu | G06F 1/20 361/694 |
| 8,208,225 B2 * | 6/2012 | Ohsawa | G11B 5/4853 360/245.9 |
| 2003/0029637 A1 | 2/2003 | Barcley | |
| 2003/0128522 A1 | 7/2003 | Takeda et al. | |
| 2005/0263320 A1 | 12/2005 | Igarashi et al. | |
| 2010/0141350 A1 | 6/2010 | Sasaki et al. | |

* cited by examiner

ELECTRONIC DEVICES COMPRISING PRINTED CIRCUIT BOARDS

CROSS-REFERENCE TO RELATED APPLICATION(S)

This application claims priority under 35 U.S.C. §119 from Italian Patent Application No. MI 2013 A 000872, filed on May 29, 2013, in the Italian Patent and Trademark Office, the entire contents of which are incorporated herein by reference.

The present invention generally relates to the field of electronic devices. In particular, the present invention relates to an electronic device comprising a printed circuit board.

It is known that a printed circuit board (PCB) allows for the electrical connection between various discrete or integrated electronic components, these being mounted directly on the surface of said printed circuit board to assemble an electronic device.

The formation of a printed circuit board proceeds from an insulating layer (typically made of fiberglass or vetronite), to which there is applied a conductive layer (typically made of copper) having a thickness which can be varied between 5 µm and 140 µm, depending on the type of application. A photolithography process is used to remove the material of the conductive layer in a selective manner, so as to form a plurality of conductive tracks, which perform the operation of electrical connection between the components which will be mounted on the finished printed circuit board. Then, a number of insulating layers (typically 5 or 6) together with the respective conductive layers are pressed together, so as to create a multilayered structure in which insulating layers alternate with conductive layers. Then, through holes are made at predetermined positions, these eventually being metallized (typically with copper) through a galvanization process. The metallized holes thus obtained electrically connect the conductive tracks present in the various conductive layers. This forms the printed circuit board, on which it is possible to mount (for example by Through Hole Technology THT or Surface Mounting Technology SMT) discrete or integrated electronic components for assembling an electronic device.

At present, it is common to use electronic devices which comprise both signal components (i.e. electronic components having electric powers of the order of tens of mW at their inlet/outlet) and power components (i.e. electronic components having electric powers of the order of tens or hundreds of kW at their inlet/outlet).

One example of these devices is an inverter. It is known that an inverter is an electronic device that is capable of converting a direct current (generally supplied by a battery) into an alternating current (generally to be supplied to an electric motor). To perform this operation, an inverter typically comprises a set of power components (generally switches), which perform the direct current/alternating current conversion, and a set of signal components, which perform a control logic for the power components.

The signal components are typically mounted on a printed circuit board, which acts as a mechanical support for said components and establishes the electrical connections therebetween. As for the power components, these are not at present mounted on the printed circuit board for the following reasons.

First of all, the conductive tracks of the printed circuit boards are not suitable for carrying high currents on account of the reduced dimensions of the cross section of the conductor.

Moreover, on account of its very construction, a printed circuit board is inefficient from a thermal aspect, that is to say it is not suitable for efficiently carrying the heat generated by the power components. Supposing indeed that the electric power at the inlet of the inverter is 100 kW and that the productivity of the inverter is 98%, the power dissipated by the inverter is 2%, that is to say 2 kW. A printed circuit board (even when mounted on a heat sink) is unable to drain such a high dissipated power, because it is formed to a large extent from fiberglass or vetronite, which, in addition to being an electrical insulator, is also a thermal insulator.

For these reasons, the power components of the inverter are generally mounted directly, by means of screws, on an aluminium heat sink and are electrically connected to one another by means of conductors, such as cables or busbars.

The inventors have noticed that the inverter described above has a number of drawbacks.

First of all, whereas the assembly of the signal components on the printed circuit board is a fast, economical and reliable industrial process, the assembly of the power components (in particular the screwed connection thereof on the heat sink and the wiring thereof) is a manual process. This is therefore slow, expensive and inherently unreliable. The resultant inverter too is therefore very expensive and may give rise to defects on account of the insufficient expertise of the person who carried out the manual assembly operations.

Moreover, the physical separation between signal components (mounted on the printed circuit board) and power components (mounted on the heat sink) gives rise to an inverter of large dimensions. The large dimensions can disadvantageously mean that the inverter is not suitable for various applications which require reduced dimensions (for example in electric cars or in household electrical appliances such as washing machines, etc.).

In the light of that indicated above, it is an object of the present invention to provide an electronic device (in particular but not exclusively an inverter) comprising at least one power component which solves the problems mentioned above.

In particular, it is an object of the present invention to provide an electronic device (in particular but not exclusively an inverter) comprising at least one power component which can be assembled by a single fast, economical and reliable industrial process and which is more compact than the inverter described above.

In the in the following description and in the claims, the term "power component" denotes an electronic component, such as, for example, a static switch, a MOSFET transistor (Metal-Oxide-Semiconductor Field-Effect Transistor), an IGBT transistor (Insulated Gate Bipolar Transistor), a resistor, etc., having an electric power greater than or equal to 100 W at at least one of its inlets/outlets.

According to the present invention, this object is achieved by an electronic device comprising at least one power component and a printed circuit board. The printed circuit board comprises a mounting element, which in turn comprises first conductive tubes which elongate through a thickness of the printed circuit board. Moreover, the printed circuit board comprises a conductor, which in turn comprises a set of stacked conductive tracks (one for each conductive layer of the printed circuit board) and second conductive tubes which elongate through a thickness of the printed circuit board and electrically connect between them the conductive tracks. The main body of the power component is fixed to the mounting element, while one of the leads thereof is connected to the conductor.

In this way, the printed circuit board makes it possible to efficiently carry the heat generated by the power component. Supposing indeed that the printed circuit board together with the power component mounted thereon is fixed to a heat sink, the mounting element (in particular the conductive tubes thereof) advantageously acts as a thermal bridge which efficiently carries the power dissipated by the power component through the thickness of the printed circuit board toward the heat sink.

Moreover, the printed circuit board makes it possible to carry the high electric currents present at the lead of the power component. More precisely, the conductive tubes of the conductor provide for communication between the conductive tracks of the various conductive layers through the thickness of the printed circuit board, so that the track-tube assembly acts like a single conductor having a very large cross section (and therefore electrical conductance).

Therefore, in the electronic device according to the present invention, the power components can be mounted on the printed circuit board together with any possible signal components. This makes it possible to manufacture the electronic device using a single industrial process, which uses substantially the same techniques as are presently employed for manufacturing printed circuit boards and for mounting signal components on the printed circuit board. This process is therefore fast, economical and reliable. As a consequence, the resultant electronic device too is inexpensive and very reliable. Moreover, the latter is very compact since all of the components thereof are located on a single printed circuit board.

According to a first aspect, the present invention provides an electronic device comprising at least one power component and a printed circuit board, the power component comprising a main body and a lead, the printed circuit board comprising at least two conductive layers parallel to a plane xy, wherein:
  the printed circuit board comprises a mounting element and a conductor;
  the mounting element comprises first conductive tubes and the conductor comprises second conductive tubes;
  the first conductive tubes and the second conductive tubes elongate through a thickness of the printed circuit board along a direction z substantially perpendicular to the plane xy; and
  the main body of the power component is fixed to the mounting element and the lead of the power component is fixed to the conductor.

Preferably, the mounting element further comprises at least two conductive pads, each of the at least two conductive pads being arranged at one of the at least two conductive layers.

Preferably, the at least two conductive pads have a same shape and are stacked along the direction z.

Preferably, the first conductive tubes pass through the at least two conductive layers at the at least two conductive pads, the first conductive tubes implementing an electrical and thermal contact between the at least two conductive pads.

Preferably, that the conductor further comprises at least two conductive tracks, each of the at least two conductive tracks being arranged at a one of the at least two conductive layers.

Preferably, that the at least two conductive tracks have a same shape and are stacked along the direction z.

Preferably, that the second conductive tubes pass through the at least two conductive layers at the at least two conductive tracks, the second conductive tubes implementing an electrical and thermal contact between the at least two conductive tracks.

Preferably, that the first conductive tubes and the second conductive tubes are obtained by drilling and metal deposition through galvanization of the printed circuit board.

According to a second aspect, the present invention provides an electric machine comprising an electronic device as mentioned above.

Preferably, the electric machine comprises a structural member in turn comprising a thermally conductive portion, and the electronic device is fixed to the thermally conductive portion of the structural member.

The present invention will become clearer in the light of the following detailed description, which is provided purely by way of non-limiting example and is to be read with reference to the enclosed drawings, in which.

The figures are not shown to scale. The figures moreover show a Cartesian reference system xyz, to which reference will be made in the course of the following description.

Figure 1:
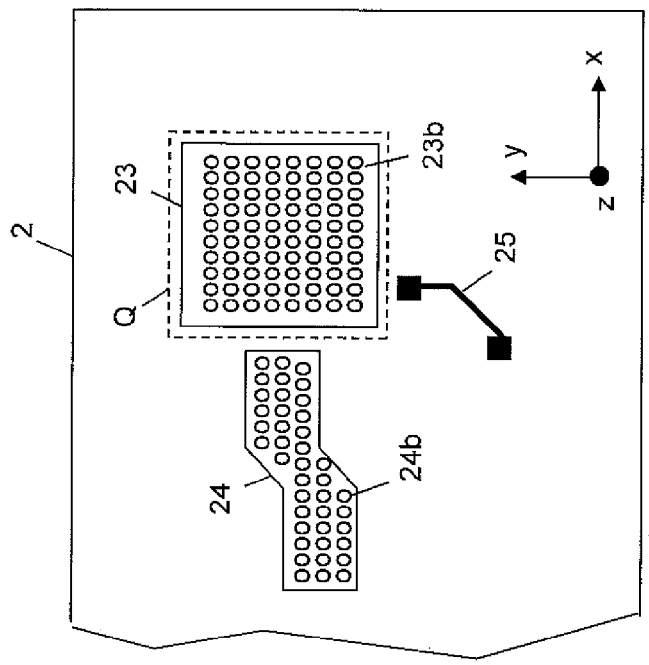
FIG. 1 is a plan view of a portion of an electronic device according to a first embodiment of the present invention.

FIG. 1 shows a portion of an electronic device 1 according to one embodiment of the present invention. By way of non-limiting example, the electronic device 1 can be a device comprising commutation circuits, for example an inverter or a DC/DC converter.

The electronic device 1 comprises a printed circuit board 2 and at least one power component. By way of non-limiting example, the portion of the electronic device 1 which is shown in FIG. 1 comprises a power component 3. The power component 3 comprises a main body 30 and at least one power lead, that is to say a lead which is able to receive or emit an electric power of the order of tens or hundreds of kW. So as not to overcomplicate the drawings, FIG. 1 shows only one power lead 31 of the power component 3. The power component 3 can be, for example, a switch, a transistor, a capacitor, an inductor, etc. Optionally, the power component 3 can also have one or more signal leads, that is to say leads which are able to receive or emit an electric power of the order of tens of mW. So as not to overcomplicate the drawings, FIG. 1 shows only one signal lead 32 of the power component 3.

The electronic device 1 can further comprise one or more signal components. By way of non-limiting example, the portion of the electronic device 1 which is shown in FIG. 1 comprises a signal component 4. The signal component 4 preferably comprises one or more signal leads. By way of non-limiting example, the signal component 4 shown in FIG. 1 comprises six signal leads 40. The signal component 4 can be, for example, an integrated component which contains a processor, a memory, etc., or a discrete component such as a transistor, a capacitor, a resistor, etc.

Figure 2:
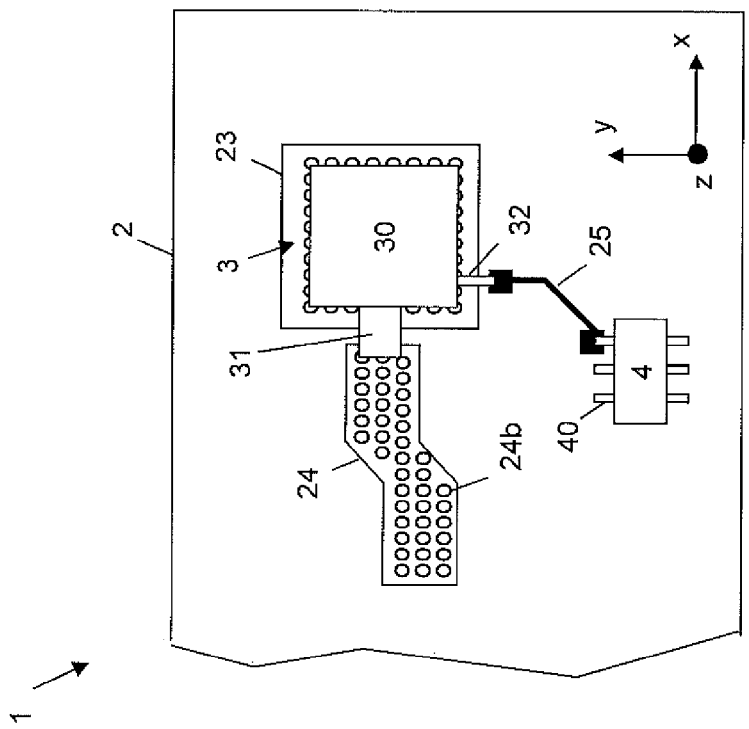
FIG. 2 is a plan view of a portion of the printed circuit board comprised in the electronic device shown in FIG. 1.
Figure 3:
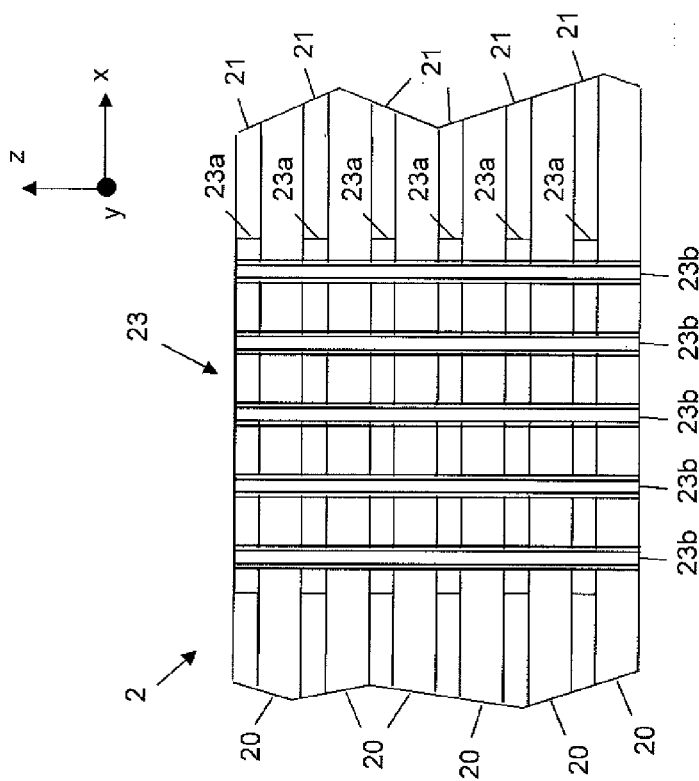
FIG. 3 is a cross-sectional view of the portion of the printed circuit board enclosed in the dotted square Q shown in FIG. 2.

Referring now to FIGS. 2 and 3, the printed circuit board 2 preferably comprises a plurality of insulating layers and a plurality of conductive layers which alternate reciprocally, extend parallel to a plane xy and are stacked in a direction z perpendicular to the plane xy. By way of non-limiting example, the printed circuit board 2 shown in the figures comprises six insulating layers 20 and six conductive layers 21 (visible in FIG. 3). The insulating layers 20 preferably comprise an electrically and thermally insulating material, for example fiberglass or vetronite. The conductive layers 21 preferably comprise an electrically and thermally conductive material, more preferably a metal such as for example copper. Each insulating layer 20 preferably has a thickness of between 100 μm and 500 μm, more preferably of between 200 μm and 400 μm. Each conductive layer 21 preferably has a thickness of between 5 μm and 150 μm, more preferably of between 10 μm and 100 μm. Exemplary thicknesses of the conductive layers 21 are 15 μm, 30 μm and 60 μm.

Preferably, the printed circuit board 2 comprises a mounting element 23 capable of supporting the main body 30 of the power component 3.

As is shown in FIG. 3, the mounting element 23 comprises one conductive pad 23a for each conductive layer 21. The conductive pads 23a of the various conductive layers 21 preferably all have a same shape (preferably square or rectangular) and substantially have the same dimensions. Furthermore, they are preferably stacked along the direction z. The conductive pads 23a are preferably formed by a process for selectively removing the material of the conductive layers 21.

Moreover, as is shown in FIGS. 2 and 3, the mounting element 23 preferably comprises a plurality of first conductive tubes 23b. The first conductive tubes 23b preferably elongate along a direction z (that is to say perpendicular to the plane of the layers 20, 21) and are preferably continuous, that is to say pass through the entire thickness of the printed circuit board 2. In this way, the first conductive tubes 23b implement an electrical and thermal contact between the conductive pads 23a of the conductive layers 21. It is preferable that the first conductive tubes 23b comprise a metal, more preferably the same metal as the conductive layers 21 (for example copper). The first conductive tubes 23b are preferably obtained by drilling the printed circuit board 2, this making it possible to obtain a plurality of continuous holes through the printed circuit board 2. The continuous holes are then metallized internally, for example by a galvanization process.

The first conductive tubes 23b preferably have a density, in the plane xy, of greater than 100 tubes/cm$^2$, more preferably of greater than 400 tubes/cm$^2$, and yet more preferably of greater than 700 tubes/cm$^2$. Furthermore, the first conductive tubes 23b preferably have an internal diameter of between 200 μm and 700 μm. The side wall of the first conductive tubes 23b furthermore preferably has a thickness of between 35 μm and 70 μm.

The inventors have found that an internal diameter of less than 200 μm would not make it possible to obtain conductive tubes 23b with a side wall of uniform thickness by means of galvanization. On the other hand, an internal diameter of more than 700 μm would involve a considerable presence of air in the first conductive tubes 23b, and this would reduce the thermal conductivity of the mounting element 23. The density of the first conductive tubes 23b, the diameter thereof and the thickness of the side wall thereof are, however, chosen depending on the thermal properties which are to be bestowed on the mounting element 23, as will be discussed in greater detail hereinbelow.

Preferably, the printed circuit board 2 also comprises at least one conductor. By way of non-limiting example, the portion of the printed circuit board 2 which is shown in FIGS. 1 and 2 comprises a conductor 24 having an end placed in the proximity of the mounting element 23.

The conductor 24 preferably comprises one conductive track (not shown in the drawings) for each conductive layer 21. The conductive tracks of the various conductive layers 21 preferably all have a same shape and have substantially the same dimensions. Furthermore, they are preferably stacked along the direction z. Like the conductive pads 23a of the mounting element 23, the conductive tracks of the conductor 24 too are preferably formed by a process for selectively removing the material of the conductive layers 21.

Moreover, as is shown in FIG. 2, the conductor 24 preferably comprises a plurality of second conductive tubes 24b. In a manner similar to the first conductive tubes 23b of the mounting element 23, the second conductive tubes 24b of the conductor 24 too preferably elongate along a direction z and are preferably continuous. In this way, the second conductive tubes 24b implement an electrical and thermal contact between the conductive tracks of the conductive layers 21. It is preferable that the second conductive tubes 24b comprise a metal, more preferably the same metal as the conductive layers 21 (for example copper). The second conductive tubes 24b are preferably formed by the same drilling and galvanization process which makes it possible to obtain the first conductive tubes 23b.

The second conductive tubes 24b preferably have a density, in the plane xy, of greater than 100 tubes/cm$^2$, more preferably of greater than 400 tubes/cm$^2$, and yet more preferably of greater than 700 tubes/cm$^2$. Furthermore, the second conductive tubes 24b preferably have an internal diameter of between 200 μm and 700 μm. The side wall of the second conductive tubes 24b furthermore preferably has a thickness of between 35 μm and 70 μm. The density of the second conductive tubes 24b, the diameter thereof and the thickness of the side wall thereof are, however, chosen depending on the electrical (and thermal) properties which are to be bestowed on the conductor 24, as will be discussed in greater detail hereinbelow.

Preferably, the printed circuit board 2 also comprises one or more conductive tracks that are distributed in the various conductive layers 21 and are capable of carrying signal currents between the power component 3 and any possible signal components. By way of non-limiting example, the portion of the printed circuit board 2 which is shown in FIGS. 1 and 2 comprises a conductive track 25 placed on the top conductive layer 21.

Preferably, the main body 30 of the power component 3 is fixed to the mounting element 23, as shown in FIG. 1. Moreover, the power lead 31 of the power component 3 is preferably soldered to the conductor 24 at its end close to the mounting element 23. In this way, it is possible to electrically connect the power component 3 to other power components present on the printed circuit board 2, or to a connector (not shown in the drawings) of the printed circuit board 2. The signal lead 32 of the power component 3 is furthermore preferably soldered to the conductive track 25 to electrically connect the power component 3 to the signal component 4.

Figure 4:
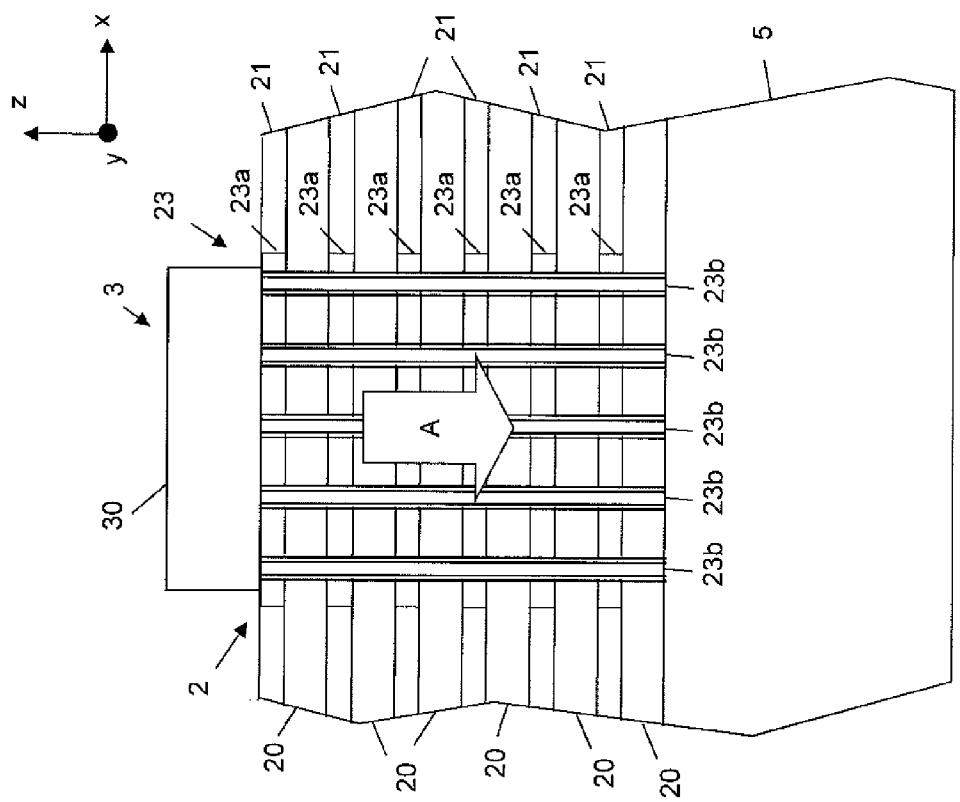
FIG. 4 is a cross-sectional view of the portion of the printed circuit board shown in FIG. 3, with a power component mounted thereon and fixed to a heat sink.

The mounting element 23 advantageously allows to efficiently drain the power dissipated by the power component 3 through the thickness of the printed circuit board 2. Supposing indeed that the printed circuit board 2 is fixed to a heat sink 5, as shown in FIG. 4, the heat sink 5 is in contact with the bottom surface of the printed circuit board 2, that is to say with the surface which lies opposite to that on which the power component 3 is fixed. The mounting element 23 is therefore interposed between the main body 30 of the power component 3 and the heat sink 5. In this way, the conductive pads 23a and the first conductive tubes 23b act as a whole as a thermal bridge which efficiently carries the power dissipated by the power component 3 through the thickness of the printed circuit board 2 toward the heat sink 5 (as denoted by arrow A in FIG. 4).

The greater the density of the first conductive tubes 23b along the plane xy, the greater the quantity of thermally conductive material present in the mounting element 23, and therefore the greater the thermal conductivity of the latter. In particular, assuming that $\phi$ is the external diameter of the first tubes 23b and s is the thickness of the side wall thereof, the internal diameter thereof is equal to:

$$\phi_{int} = \phi - 2 \cdot s \quad [1]$$

Supposing that the first tubes 23b are made of copper, the cross-sectional area (that is in the plane xy) of copper in each tube 23b is therefore equal to:

$$A_m = \pi\left[\left(\frac{\phi}{2}\right)^2 - \left(\frac{\phi_{int}}{2}\right)^2\right] \quad [2]$$

Assuming now that fd is the linear density factor of the first tubes 23b on the surface of the mounting element 23 in both directions x and y, the total number of first tubes 23b in a square reference area $A_{rif}$ with side $L_{rif}$ is equal to:

$$nf = \left[\text{int}\left(\frac{L_{rif}}{\phi + s}\right) \cdot fd\right]^2 \quad [3]$$

The total copper area present within the reference area $A_{rif}$ is therefore equal to:

$$A_{Cu} = nf \cdot A_m \quad [4]$$

The area percentage of the copper in the reference area $A_{rif}$ is therefore equal to:

$$\% \, Cu = \frac{A_{Cu}}{A_{rif}} = \frac{nf \cdot A_m}{L_{rif}^2} \quad [5]$$

The thermal efficiency of the mounting element 23 with respect to an element made entirely of aluminium having the same area (and therefore the same volume) is therefore equal to:

$$\eta_{ter} = \frac{k_{CU} \cdot A_{Cu}}{k_{Al} \cdot A_{rif}} = \frac{k_{Cu}}{k_{Al}} \cdot \% \, Cu \quad [6]$$

where $k_{Cu}$ is the coefficient of thermal conductivity of the electrolytic copper (equal to 335 W/mK) and $k_{Al}$ is the coefficient of thermal conductivity of the aluminium (equal to 204 W/mK).

It is preferable that the diameter $\phi$, the thickness s and the density factor fd of the first tubes 23b are chosen such that the area percentage of copper % Cu within the mounting element 23 is greater than 10%, more preferably greater than 20%, yet more preferably greater than 40%. As an alternative, the diameter $\phi$, the thickness s and the density factor fd of the first tubes 23b are chosen such that the thermal efficiency $\eta_{ter}$ of the mounting element 23 is greater than 10%, more preferably greater than 30%, yet more preferably greater than 60%. By applying the equations above, the inventors have indeed estimated that, if the percentage area of copper % Cu is 50-60%, the mounting element 23 can achieve a thermal conductivity of 100-150 W/m·k, that is approximately 200-300 times greater than that of the printed circuit board 2 outside the mounting element 23. The thermal conductivity achieved by the mounting element 23 is advantageously comparable to that which would be obtained by mounting the main body 30 of the power component 3 directly on the heat sink 5.

By way of example, where $\phi$=0.3 mm, s=0.07 mm and fd=1, applying equations [1]-[5] above gives an area percentage of copper % Cu=approximately 37%, which makes it possible to obtain a thermal efficiency $\eta_{ter}$=60.54% (calculated using equation [6] above). Where, instead, $\phi$=0.4 mm, s=0.035 mm and fd=1, applying equations [1]-[5] above gives an area percentage of copper % Cu=approximately 19%, which makes it possible to obtain a thermal efficiency $\eta_{ter}$=31.89% (calculated using equation [6] above). Where, instead, $\phi$=0.4 mm, s=0.035 mm and fd=0.5, applying equations [1]-[5] above gives an area percentage of copper % Cu=approximately 5%, which makes it possible to obtain a thermal efficiency $\eta_{ter}$=7.97% (calculated using equation [6] above).

On the other hand, the conductor 24 advantageously makes it possible to carry the electric current present at the power lead 31 of the power component 3. To be precise, the second conductive tubes 24b advantageously increase the useful cross section of the conductor 24, and therefore the electrical conductivity thereof.

The greater the density of the second conductive tubes 24b, the greater the cross section of the conductor 24, and therefore the greater the electrical conductivity thereof. In particular, assuming that $\phi$ is the external diameter of the second tubes 24b and s is the thickness of the side wall thereof, equations [1]-[5] above are applied to calculate the area percentage of copper for the conductor 24, too. The electrical efficiency (that is as an electrical conductor) of the conductor 24 with respect to a conductor made entirely of copper having the same area (and therefore the same volume) is therefore equal to:

$$\eta_{ele} = \frac{\rho_{Cu} \cdot A_{Cu}}{\rho_{Cu} \cdot A_{rif}} = \% \, Cu, \quad [7]$$

where $\rho_{Cu}$ is the electrical resistivity of the electrolytic copper (equal to 0.0176 ohm·m/mm²).

Preferably, the diameter $\phi$, the thickness s and the density factor fd of the second tubes 24b are chosen such that the area percentage of copper % Cu within the conductor 24 is greater than 10%, more preferably greater than 20%, yet more preferably greater than 40%. As an alternative, the diameter $\phi$, the thickness s and the density factor fd of the second tubes 24b are chosen such that the electrical efficiency $\eta_{ele}$ of the conductor 24 is greater than 10%, more preferably greater than 20%, yet more preferably greater than 40%.

By way of example, where $\phi$=0.3 mm, s=0.07 mm and fd=1, applying equations [1]-[5] above gives an area percentage of copper % Cu=approximately 37%, which makes it possible to obtain an electrical efficiency $\eta_{ele}$=36.87% (calculated using equation [7] above). Where, instead, $\phi$=0.4 mm, s=0.035 mm and fd=1, applying equations [1]-[5] above gives an area percentage of copper % Cu=approximately 19%, which makes it possible to obtain a thermal efficiency $\eta_{ele}$=19.42% (calculated using equation [7] above). Where, instead, $\phi$=0.4 mm, s=0.035 mm and fd=0.5, applying equations [1]-[5] above gives an area percentage of copper % Cu=approximately 5%, which makes it possible to obtain a thermal efficiency $\eta_{ele}$=4.86% (calculated using equation [7] above).

By way of example, it is supposed that the printed circuit board 2 comprises six insulating layers 20 made of vetronite and six conductive layers 21 made of copper having a thickness of 60 μm. The conductor 24 comprises a conductive track of width 20 mm for each of the six conductive layers 21. Each conductive track therefore has a cross section of 20 mm×60 μm=1.2 mm². If the second conductive tubes 24b were not present, the conductor 24 would therefore have an equivalent cross section of 1.2 mm²×6=7.2 mm². Assuming that the current capacity is 3 A/mm², the maximum carriable current would therefore be 3 A/mm²×7.2 mm²=21.6 A. It will now be assumed that the second conductive tubes 24b have a diameter of 0.2 mm, a reciprocal spacing of 0.4 mm and a side wall having a thickness of 50 μm. On each section of the conductor 24, there are therefore 20 mm/0.4 mm=100 second conductive tubes 24b. Assuming that the overall thickness of the printed circuit board 2 is 1.6 mm, the equivalent cross section of the conductor 24 is therefore 7.2 mm²+(1.6×2×0.05×100)= 7.2 mm²+16 mm²=23.2 mm². In other words, owing to the second conductive tubes 24b, the cross section of the conductor 24 is more than tripled. If the current capacity is 3 A/mm², the maximum current which can be carried by the conductor 24 is therefore 3 A/mm²×23.2 mm²=69 A.

Furthermore, in a manner similar to the first conductive tubes 23b of the mounting element 23, the second conductive tubes 24b of the conductor 24 too act as a thermal bridge along the direction z and make it possible to drain the power dissipated by the Joule effect in the conductor 24. This makes it possible to reduce the temperature of the conductor 24 and therefore to increase the electrical conductivity further. In particular, the inventors have estimated that, with the parameters above, the reduction in temperature caused by the second conductive tubes 24b would entail an increase in the current capacity from 3 A/mm² to 10 A/mm². This means that the maximum carriable current increases up to 10 A/mm²× 23.2 mm²=232 A, that is to say ten times that which can be carried by the conductor 24 without second conductive tubes 24b. The conductor 24 is therefore advantageously able to carry currents of the order of hundreds of amperes.

Furthermore, the inventors have noticed that, if the electronic device 1 is an inverter, the conductor 24 with the second conductive tubes 24b has a further advantage. As mentioned above, the function of an inverter is to commutate a direct current into an alternating current. The alternating current has a waveform corresponding to the superimposition of a fundamental harmonic and upper harmonics. It is typical that the devices which make use of the alternating current supplied by an inverter use the electric power corresponding only to the fundamental harmonic, whereas the electric power corresponding to the upper harmonics is dissipated. To minimize the power dissipated, it is therefore necessary to minimize the amplitude of the upper harmonics. This can be done by increasing the commutation frequency of the switches of the inverter, in such a way that the waveform at the outlet of the inverter approximates the fundamental harmonic as best as possible. Nevertheless, an increase in the commutation frequency entails an increase in what is termed the skin effect. It is known that, according to the skin effect, the alternating current carried by a conductor is concentrated only in a peripheral portion of the conductor, the thickness of which decreases with an increasing frequency.

The conductor 24 is therefore particularly suitable for carrying current in the presence of a skin effect. This is indeed in large part provided by the conductive tubes 24b, these being wires and therefore having an extremely advantageous total cross section/useful cross section ratio.

The electronic device 1 therefore has a number of advantages.

First of all, it comprises a printed circuit board which can simultaneously support both signal components and power components owing to the mounting elements which can drain the power dissipated by the power components and owing to the conductors which can carry the electric currents at the inlet/outlet of the power components.

The device 1 can therefore advantageously be manufactured using a single industrial process, which uses substantially the same techniques as are presently employed for manufacturing printed circuit boards and for mounting signal components on the printed circuit board. This process is therefore fast, economical and reliable. As a consequence, the electronic device 1 too is inexpensive and very reliable.

Moreover, the electronic device 1 is very compact since all of the signal and power components thereof are located on the same printed circuit board 2. It is therefore particularly suitable for applications in which reduced dimensions are a basic requirement.

Moreover, the electronic device 1 can be pressed directly onto a thermally conductive element acting as a heat sink using a process which is entirely similar to that which makes it possible to press the layers of the printed circuit board 2 together.

In particular, if the electronic device 1 is being used in an electric machine (such as for example an electric or hybrid drive motor vehicle, a household electrical appliance, etc.) comprising a structural component (for example the platform of a motor vehicle or the outer casing of a household electrical appliance) made of thermally conductive material, the electronic device 1 can be pressed directly onto said structural component. In this way, the structural component of the electric machine also performs a mechanical support and heat dissipation function for the electronic device 1. It is therefore not necessary to provide either any support element or separate protection element or any separate heat sink, in as much as it is the structural member itself which performs these functions for the electronic device 1. The electric machine as a whole is therefore lighter, compact and has a simpler structure.

The invention claimed is:

1. An electronic device, comprising;
    at least one power component; and
    a printed circuit board;
    wherein the at least one power component comprises:
        a main body; and
        a lead;
    wherein the printed circuit board comprises at least two conductive layers parallel to a plane,
    wherein the printed circuit board further comprises:
        a mounting element; and
        a conductor;
    wherein the mounting element comprises first conductive tubes,
    wherein the conductor comprises second conductive tubes,
    wherein the first conductive tubes and the second conductive tubes elongate through a thickness of the printed circuit board along a direction substantially perpendicular to the plane,
    wherein the main body of the at least one power component is fixed to the mounting element, and
    wherein the lead of the at least one power component is fixed to the conductor.

2. The electronic device of claim 1, wherein the mounting element further comprises:
    at least two conductive pads;
    wherein each of the at least two conductive pads is at one of the at least two conductive layers.

3. The electronic device of claim 2, wherein the at least two conductive pads have a same shape and are stacked along the direction substantially perpendicular to the plane.

4. The electronic device of claim 2, wherein the first conductive tubes pass through the at least two conductive layers at the least two conductive pads, the first conductive tubes configured to implement electrical and thermal contact between the at least two conductive pads.

5. The electronic device of claim 1, wherein the conductor further comprises:
   at least two conductive tracks;
   wherein each of the at least two conductive tracks is at one of the at least two conductive layers.

6. The electronic device of claim 5, wherein the at least two conductive tracks have a same shape and are stacked along the direction substantially perpendicular to the plane.

7. The electronic device of claim 5, wherein the second conductive tubes pass through a thickness of the at least two conductive layers at the at least two conductive tracks, the second conductive tubes configured to implement electrical and thermal contact between the at least two conductive tracks.

8. The electronic device of claim 1, wherein the first conductive tubes and the second conductive tubes are obtained by drilling and metal deposition through galvanization of the printed circuit board.

9. An electric machine comprising the electronic device of claim 1.

10. The electric machine of claim 9, further comprising:
    a structural member;
    wherein the structural member comprises a thermally conductive portion, and
    wherein the electronic device is fixed to the thermally conductive portion.

11. The electronic device according to of claim 2, wherein the at least two conductive pads have a same shape.

12. The electronic device according to of claim 2, wherein the at least two conductive pads are stacked along the direction substantially perpendicular to the plane.

13. The electronic device of claim 2, wherein the first conductive tubes pass through the at least two conductive layers at the at least two conductive pads, the first conductive tubes configured to implement electrical contact between the at least two conductive pads.

14. The electronic device of claim 2, wherein the first conductive tubes pass through the at least two conductive layers at the at least two conductive pads, the first conductive tubes configured to implement thermal contact between the at least two conductive pads.

15. The electronic device of claim 5, wherein the at least two conductive tracks have a same shape.

16. The electronic device of claim 5, wherein the at least two conductive tracks are stacked along the direction substantially perpendicular to the plane.

17. The electronic device of claim 5, wherein the second conductive tubes pass through a thickness of the at least two conductive layers at the at least two conductive tracks, the second conductive tubes configured to implement electrical contact between the at least two conductive tracks.

18. The electronic device of claim 5, wherein the second conductive tubes pass through a thickness of the at least two conductive layers at the at least two conductive tracks, the second conductive tubes configured to implement thermal contact between the at least two conductive tracks.

19. The electronic device of claim 1, wherein the first conductive tubes are obtained by drilling and metal deposition through galvanization of the printed circuit board.

20. The electronic device of claim 1, wherein the second conductive tubes are obtained by drilling and metal deposition through galvanization of the printed circuit board.

* * * * *